(12) United States Patent
Einfeldt

(10) Patent No.: US 6,542,010 B2
(45) Date of Patent: Apr. 1, 2003

(54) DETECTOR CIRCUIT FOR DETECTING VOLTAGE SPIKES

(75) Inventor: Walter Einfeldt, Uetersen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/128,640

(22) Filed: Apr. 23, 2002

(65) Prior Publication Data

US 2002/0186053 A1 Dec. 12, 2002

(30) Foreign Application Priority Data

Apr. 25, 2001 (DE) .......................... 101 20 142

(51) Int. Cl.[7] .............................................. H03K 5/153
(52) U.S. Cl. ......................................... 327/78; 327/318
(58) Field of Search .......................... 327/78, 309, 318, 327/310

(56) References Cited

U.S. PATENT DOCUMENTS

| | | | | |
|---|---|---|---|---|
| 4,331,921 A | * | 5/1982 | Walker | 324/380 |
| 4,595,959 A | * | 6/1986 | Bailey | 360/67 |
| 4,785,390 A | * | 11/1988 | Zelina et al. | 323/238 |
| 5,847,581 A | * | 12/1998 | Allen | 326/81 |
| 6,330,463 B1 | * | 12/2001 | Hedrich | 455/573 |

* cited by examiner

Primary Examiner—Kenneth B. Wells
Assistant Examiner—Cassandra Cox
(74) Attorney, Agent, or Firm—Steven R. Biren

(57) ABSTRACT

The invention relates to a detector circuit (100) for detecting short-lasting voltage pulses (spikes) in a power supply voltage (VDD). An integrator (INT) forms the average value (VDD_AV) of the power supply voltage (VDD) and a corresponding energy is stored in a first memory (MEM1). A comparator (COMP) compares the power supply voltage (VDD) with a predetermined voltage interval ([Vref1, Vref2]) and closes a switch (S) when the power supply voltage is outside this interval. The energy from the first memory (MEM1) then flows into a second memory (MEM2) via the switch (S) and a delay circuit (DELAY). When the energy in the second memory (MEM2) exceeds a threshold value, an output stage (OUT) is thereby activated, whose output supplies a signal (SPIKE_DET) indicating a voltage spike.

10 Claims, 2 Drawing Sheets

DETECTOR CIRCUIT FOR DETECTING VOLTAGE SPIKES

FIELD OF THE INVENTION

The invention relates to a method and a detector circuit for detecting short-lasting voltage pulses (spikes) in a power supply voltage, and to a data processing unit such as particularly a smart card.

BACKGROUND OF THE INVENTION

When operating electronic apparatuses, it is important to protect them against fluctuations of the power supply voltage for the apparatus. Such fluctuations may occur under the influence of the circuit but may also be attempts to manipulate the circuit. The latter will hereinafter be elucidated by way of example with reference to a smart card.

Smart card controller chips have in common that security-relevant data are stored in these cards, which data should be absolutely protected against abuse by third parties. One of the many possible attack scenarios is the operation of the circuits with power supply voltages outside the specified or allowed range. An attack with static voltages will generally have no effect because circuits of this type are customarily protected adequately by voltage sensors. It is, however, feasible to attack the power supply voltage with short pulses which may be both negative and positive. When these pulses have a width which is within the reaction time of the voltage sensors but beyond the response time of the circuit to these events, such an attack might be successful.

OBJECT AND SUMMARY OF THE INVENTION

It is therefore an object of the invention to provide a method and a circuit for detecting short-lasting voltage pulses (spikes) in a power supply voltage with which a microelectronic circuit, such as particularly a smart card controller chip, can be protected against such spikes. The function of this detector circuit and the protection should particularly be ensured also independently of the value of the power supply voltage during a spike.

This object is achieved by a detector circuit as defined in claim 1, a data processing unit as defined in claim 9 and a method as defined in claim 10. Advantageous embodiments are defined in the dependent claims.

According to the invention, the detector circuit for detecting short-lasting voltage pulses in a power supply voltage comprises the following elements:

a) a first memory for storing a typically electric energy provided by the power supply voltage;
b) a second memory for energy, which second memory is connected to the first memory via a switch;
c) a comparator which is connected at its input to the power supply voltage and to at least a reference voltage, and whose output is coupled to the switch in such a way that it closes said switch when the power supply voltage is outside a predetermined voltage interval;
d) an output circuit which is connected at its input to the second memory and is adapted in such a way that it generates an output signal when the energy in the second memory exceeds a predetermined threshold value.

The detector circuit described ensures a secure function during the occurrence of a spike in the power supply voltage, with a continued indication of this spike beyond its duration. This secure function is achieved in that energy is stored in the first memory during normal operation, which energy is available in the case of a spike determined by the comparator and which is to be evaluated by the output circuit. For this purpose, said energy is passed from the first memory to a second memory where it is detected by the output circuit and can be used for generating an output signal indicating a spike when a threshold value is exceeded. This output signal may be available as long as the energy in the second memory is above the threshold value. Accordingly, the output circuit can indicate the detection of a spike also when this spike has already finished and the switch between the first and the second memory has already been opened again by the comparator. Such a continuing indication is advantageous because it allows a main circuit, such as, for example a smart card controller chip, connected to the detector circuit to appropriately react to the occurrence of the spike only after the spike has decayed. During the spike itself, such a reaction by the main circuit is not ensured with sufficient certainty because it is the spike which may lead to a disturbance of the power supply voltage and hence of the main circuit.

There are several possibilities for the definition of the interval within which the power supply voltage must lie so as to prevent the comparator from being activated. For example, this interval may be particularly defined by a predetermined lower reference voltage and a predetermined upper reference voltage. However, similarly, the upper limit of the interval may be mathematically at an infinite value so that the comparator is only activated at a value falling below a predetermined lower reference value. This reference value may be particularly constituted by the average value of the power supply voltage or by the ground potential. It is of course also possible to activate the comparator only when a predetermined upper reference value is exceeded, by predetermining a negatively infinite lower interval limit.

The detector circuit preferably comprises an integrator connected to the power supply voltage, the output of this integrator being connected to the first memory. Such an integrator may constitute a gliding average value of the power supply voltage and may be used for charging the first memory and possibly for operating further parts of the detector circuit.

In accordance with a further embodiment of the detector circuit, the second memory is constituted in such a way that it is self-discharging at a predetermined time constant. Energy once stored in this second memory is thus automatically built up again so that an overflow of the second memory falls below the threshold for activating the output circuit after a certain period of time. It is thereby ensured that the indication of a detected spike by the output signal of the output circuit is eliminated again after a predetermined maximum period of time which is dependent on the charge state of the second memory.

In accordance with a further embodiment of the detector circuit, a delay circuit for delaying the energy stream is arranged in the connection between the first memory and the second memory. This delay circuit ensures that the energy in the first memory does not flow too fast or not instantaneously into the second memory when a spike occurs, but that it requires a given period of time for this purpose. When a spike is therefore very short, a correspondingly small amount of energy is transported to the second memory so that it may not be sufficient to exceed the threshold value for activating the output circuit. A possibly unwanted detection of too short spikes is thus prevented by the delay circuit.

The first memory of the detector circuit may be particularly constituted by a first capacitor connected between ground and the power supply voltage, which capacitor stores energy from the power supply voltage in the form of charge. The connection of the capacitor to the power supply voltage is preferably established by means of a first resistor so that an RC member is obtained which simultaneously forms an average value (integration) and stores the power supply voltage. Moreover, a diode, which becomes conducting when its threshold voltage is exceeded and thus ensures a faster recharging of the capacitor, may be arranged parallel to said first resistor.

For realizing the comparator, a first transistor may be used whose gate (base) is connected to the power supply voltage, whose source (emitter) is connected to the first memory and whose drain (collector) is connected to the second memory. The connection of the drain to the second memory is preferably established via an interpositioned second resistor. A transistor used as described compares the voltage at the first memory with the power supply voltage at the gate and is turned on when the difference between these voltages exceeds the threshold voltage of the transistor. In this case, the transistor connects the first memory to the second memory so that this can lead to a (partial) transfer of the stored energies. The optional second resistor in the connection between the first and the second memory ensures a possibly desirable delay of the charging process between the memories.

The second memory may be particularly constituted by a second capacitor whose first terminal is directly or indirectly connected to the comparator output and whose second terminal is directly or indirectly connected to ground. Such a capacitor may store energy in the form of charge. The first terminal of the second capacitor connected to the comparator output is preferably also connected to ground additionally via a third resistor. A time constant, at which the second capacitor is automatically discharged, can then be predetermined via this third resistor. Energy once stored in the second capacitor thus builds up automatically again so that an activation of the output circuit is terminated at the end of a maximal period of time.

In accordance with a further embodiment of the last-mentioned realization of the detector circuit, the output circuit is constituted by a second transistor whose gate (base) is connected to the first terminal of the second capacitor and whose source (emitter) is connected to ground, and from whose drain (collector) the output signal can be tapped. The output signal of this transistor indicating a spike thus consists in that its drain is passed towards ground potential (LOW state). Furthermore, the transistor is turned on by the energy in the second memory. Both characteristic features ensure that the function and the output signal of the transistor are independent of the current value of the (disturbed) power supply voltage.

The invention also relates to a data processing unit which may be particularly a smart card. The data processing unit is characterized in that it comprises a detector circuit of the type described above for detecting short-lasting voltage pulses (spikes) in the power supply voltage, the output circuit of this detector circuit being coupled to an error treatment circuit of the data processing unit. The error treatment circuit appropriately reacts to the occurrence of a spike in the power supply voltage, which is indicated by the output signal of the detector circuit. In a smart card, this provides a particularly effective protection against attempted attacks on the circuit by spikes impressed on the power supply voltage.

The invention also relates to a method of detecting voltage spikes in a power supply voltage, which method comprises the steps of a) storing energy provided by the power supply voltage in a first memory;
b) passing on said energy to a second memory when the power supply voltage is outside a predetermined interval;
c) generating an output signal by means of the energy in the second memory, when the energy in the second memory exceeds a predetermined threshold value.

A secure detection of spikes in the power supply voltage is possible by means of said method, because only energy previously stored in the first memory is used for generating the output signal. The method thus does not depend on the fact that a power supply voltage allowing the output signal to be generated is available during the period of a spike. The method may be particularly carried out with a detector circuit of the type described hereinbefore, in which the detector circuit variants described lead to corresponding further embodiments of the method.

BRIEF DESCRIPTION OF THE DRAWINGS

These and other aspects of the invention are apparent from and will be elucidated with reference to the embodiments described hereinafter.

In the drawings.

DESCRIPTION OF EMBODIMENTS

Figure 1:
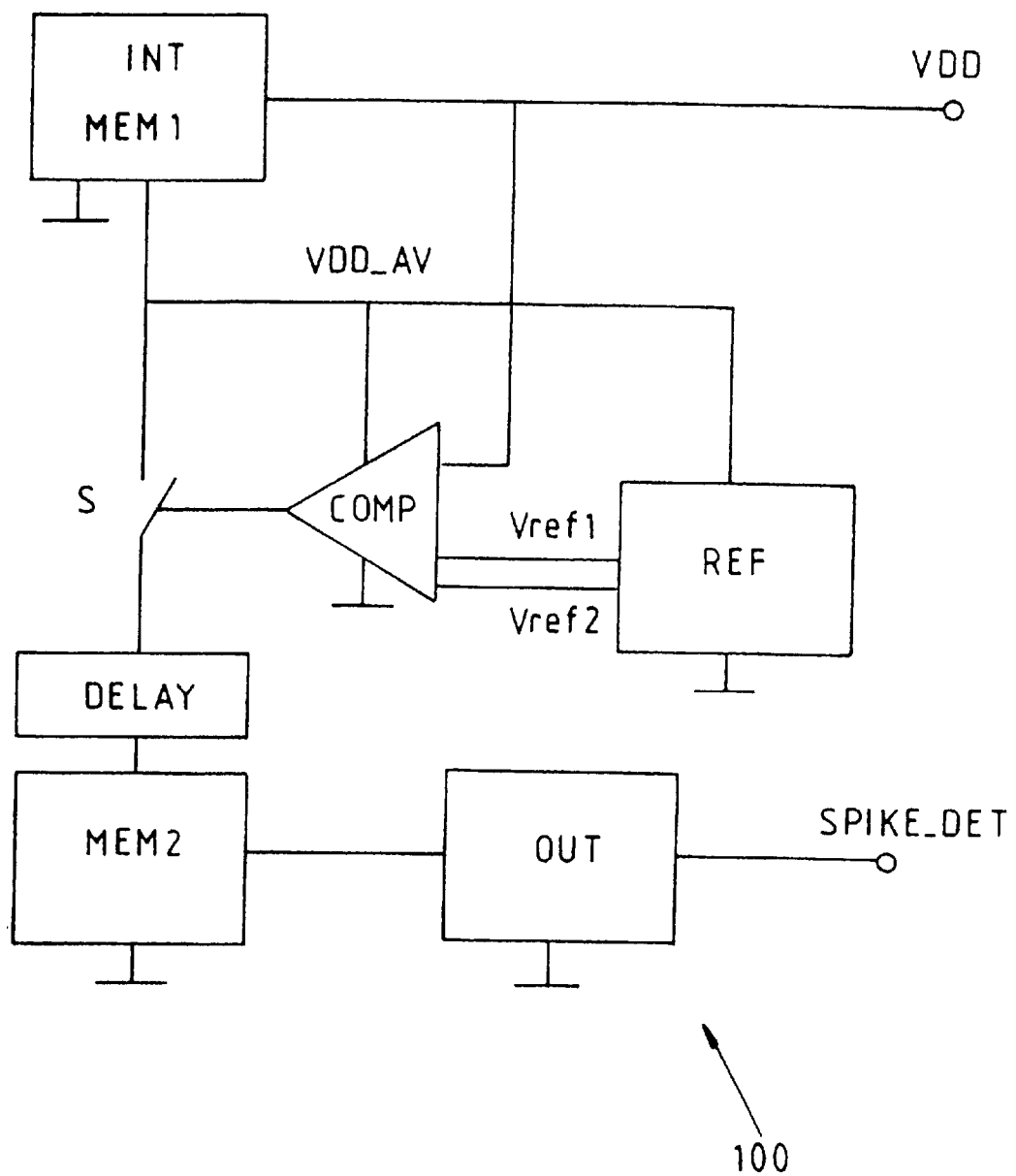
FIG. 1 is a block diagram of a detector circuit according to the invention.

The detector circuit 100 shown in FIG. 1 is used for detecting very short pulses (having a duration from 0.01 to 2 $\mu$s), referred to as spikes, in a power supply voltage VDD and for generating a corresponding output signal SPIKE__DET when such a spike is detected. This output signal can then be used by a main circuit (not shown) so as to appropriately react to the spike in the power supply voltage VDD. The main circuit may be particularly a smart card controller chip which can be protected in this way from abusive attacks by means of spikes impressed on the power supply voltage VDD.

A decisive factor is that a normally sufficient quality of the power supply voltage and hence a secure function of the circuit to be protected is not guaranteed during the period of occurrence of this spike. The occurrence of such a spike must therefore be stored in the sensor circuit until the circuit to be protected is adequately operable again after the power supply has been restored and can appropriately react to the results. The reaction of the circuit to be protected to the output signal of the sensor may thus not take place already during the spike but only at the instant when the power supply has been restored to the undisturbed value. The circuit 100 shown in FIG. 1 ensures this by virtue of its structure described hereinafter.

The power supply voltage VDD in the detector circuit 100 is initially applied to an integrator INT connected to ground, with a memory MEM1. The integrator constitutes the average value VDD__AV of the power supply voltage VDD to be monitored and stores it in memory MEM1. This stored energy is used at a later stage as auxiliary energy for the detector circuit 100 because the main power supply via the power supply voltage VDD is not ensured during a spike.

The integrator INT or the memory MEM1 passes on the averaged power supply voltage VDD__AV via its output to a switch S, to the power supply input of a comparator COMP and to a voltage reference REF.

The comparator COMP is coupled at its input to the power supply voltage VDD as well as to one or possibly two reference voltages Vref1 and Vref2, respectively, which are provided by the voltage reference REF. When, as shown in FIG. 1, two reference voltages Vref1 and Vref2 are connected to the comparator COMP, this comparator is a window comparator whose output is activated when the power supply voltage VDD is outside the interval I=[Vref1; Vref2]. Alternatively, only a simple comparator may be used which receives only a reference voltage Vref from the voltage reference REF. The output of such a comparator would become active, for example, when the power supply voltage VDD is below (or alternatively above) this reference voltage Vref. The single comparison voltage Vref could be particularly the averaged power supply voltage VDD_AV so that the comparator detects a negative spike in the power supply voltage VDD which leads to a value below the average value VDD_AV. The single reference voltage Vref may also be ground potential so that the comparator detects spikes relative to the ground potential.

When the comparator COMP detects the conditions for the presence of a spike in the power supply voltage VDD, which conditions are predetermined by its connection and the reference voltage or voltages, it activates its output and thereby closes the switch S. Consequently, the memory MEM1 is connected to a second memory MEM2 via a delay circuit DELAY. At least a part of the energy from memory MEM1 is thereupon transferred to the second memory MEM2 in a delayed manner.

The second memory MEM2 is also coupled to an output stage OUT. When the energy in the second memory MEM2 exceeds a predetermined value, the output stage OUT is activated and its output supplies the output signal SPIKE_DET. This signal SPIKE_DET is generated by means of the energy stored in the second memory MEM2 and is thereby independent of the current value of the power supply voltage VDD.

The detector circuit 100 is preferably provided for processing spikes of a defined length. The second memory MEM2 is therefore constituted in such a way that the energy stored therein has been consumed after a given period of time. In this way, the maximal width of a spike still leading to a triggering action is defined. It is true that longer spikes are still detected but they are no longer supplied for a sufficiently long time. The transfer of energy from the first memory MEM1 to the second memory MEM2 via the switch S operated by the comparator is substantially without inertia so that also very short spikes can be detected. If this is not desirable, because very short disturbances which would not disturb the circuit may nevertheless trigger the detector, the transfer of energy can be delayed by the delay block DELAY to such an extent that not enough energy to trigger the detector is built up in the second memory MEM2 in the case of too short pulses. In this way, the minimal width of a spike which still leads to a triggering action is defined. Shorter spikes are not detected anymore.

Figure 2:
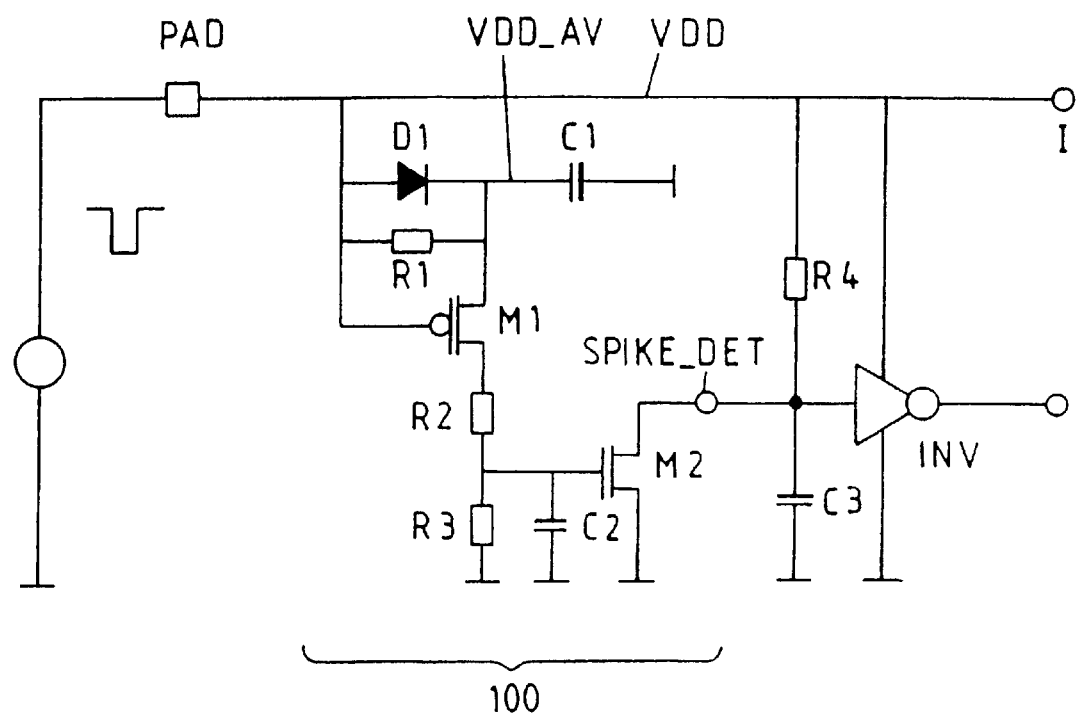
FIG. 2 is a connection diagram for realizing such a detector circuit.

FIG. 2 shows a circuit structure for a detector circuit 100 for detecting negative spikes relative to the average power supply voltage VDD_AV. The externally provided power supply voltage VDD is present at a terminal PAD. From this terminal, it is also supplied at a terminal I for internal power supply of a main circuit (not shown) such as, for example, a smart card controller chip.

A capacitor C1 is connected as a first memory to the power supply voltage VDD via a first resistor R1 and, parallel thereto, via a diode D1. The other terminal of the capacitor C1 is connected to ground. The diode D1, the resistor R1 and the capacitor C1 constitute the average value VDD_AV of the power supply voltage VDD and store it in the capacitor C1.

Furthermore, a first transistor M1 is provided, whose source is connected to the first capacitor C1 from which it taps the average power supply voltage VDD_AV, and whose drain is connected via a second resistor R2 to the first terminal of a second capacitor C2 whose second terminal is connected to ground potential. The gate of this first transistor M1 is connected to the power supply voltage VDD.

The voltage drop at the first resistor R1 in the quiescent state corresponds to the disturbing signals in the power supply voltage VDD and is substantially smaller in the transient state than the threshold voltage of the P-channel MOS transistor M1. The transistor M1 is consequently turned off in this state.

The first terminal of the second capacitor C2 is connected to ground via a third resistor R3 so that it is discharged when the transistor M1 is turned off.

The first terminal of the second capacitor C2 is further connected to the gate of a second N-channel MOS transistor M2 whose source is connected to ground potential. In the discharged state of the second capacitor C2, the second transistor M2 is thus also turned off.

The drain output of the second transistor M2, which provides the output signal SPIKE_DET, is connected to the first terminal of a third capacitor C3, whose second terminal is connected to ground potential. The first terminal of this third capacitor C3 is further coupled to the power supply voltage VDD via a fourth resistor R4. Furthermore, the first terminal of the third capacitor C3 is connected to the input of an inverter INV whose power supply terminals are connected between the power supply voltage VDD and ground. When the second transistor M2 is turned off, the third capacitor C3 is charged via the fourth resistor R4 to the value of the power supply voltage VDD, so that the LOW state results at the output of the inverter INV.

When the power supply voltage VDD has a negative voltage jump which is larger than the threshold voltage of the first transistor M1, this transistor is turned on and transports a part of the charge from the first capacitor C1 to the second capacitor C2 via the second resistor R2. When the transferred charge in the second capacitor C2 leads to a voltage which is larger than the threshold voltage of the second transistor M2, this corresponds to the state indicated by the detection of a spike. The second transistor M2 will be turned on in this state and discharges the third capacitor C3. At the latest when the power supply voltage VDD returns to the undisturbed value, the HIGH state appears at the output of the inverter INV. This state is maintained until the second capacitor C2 has been discharged via the third resistor R3. Then, the third capacitor C3 is released by turning off the second transistor M2 and the HIGH signal at the output of the inverter INV disappears after a period of time defined by the third capacitor C3 and the fourth resistor R4.

The third capacitor C3, the fourth resistor R4 and the inverter INV are not necessarily components of the detector circuit but represent a possible processing of the output signal SPIKE_DET in the circuit to be protected.

Since the second capacitor C2 is discharged by the third resistor R3 within a given period of time, the output signal SPIKE_DET disappears after a predetermined period of time. The operation of the detector circuit is thus limited to spikes below a given width. This width is adjustable by means of the third resistor R3.

If there is no resistor R2 or if R2=0, the charge transfer from the first capacitor C1 to the second capacitor C2 is realized substantially without inertia, which renders the detector also sensitive to very short negative spikes. If the triggering action below a given minimal width of the spike is not desirable, the charge transfer from the first capacitor C1 to the second capacitor C2 may be slowed down by correspondingly high values of the second resistor R2. The minimal pulse width for the detector circuit to respond can thus be adjusted by means of the second resistor R2.

In order that the voltage at the first capacitor C1 returns as rapidly as possible after a serious disturbance to the average value of the undisturbed power supply, the diode D1 is provided. It accelerates the charge of the first capacitor C1 in the initial phase and becomes ineffective at a later stage.

The response threshold of the detector circuit is given by the threshold voltage of the first MOS transistor M1. It relates to the average value VDD_AV of the power supply voltage and adapts itself to automatically changing power supply voltages VDD in this way.

The detector circuit according to the invention is also capable of detecting very short disturbing signals. It stores the occurrence of disturbing signals so that a triggering action may also follow at a later stage when the circuit to be protected would become provisionally incapable of functioning during the period of disturbance. The response behavior of the detector circuit may be easily adapted to the requirements imposed by the respective applications. When the threshold value is defined relative to the average value of the power supply voltage, it can follow changing power supply levels without any problem. Furthermore, the circuit does not consume any current in the inactive state and does not require any additional measures for a power-down.

| List of reference signs | |
|---|---|
| 100 | detector circuit |
| C1, C2, C3 | capacitors |
| COMP | comparator |
| D1 | diode |
| DELAY | delay circuit |
| I | internal terminal |
| INT | integrator |
| INV | inverter |
| M1, M2 | transistors |
| MEM1, MEM2 | memories |
| OUT | output stage |
| PAD | voltage terminal |
| R1, R2, R3, R4 | resistors |
| S | switch |
| SPIKE_DET | output signal |
| VDD | power supply voltage |
| VDD_AV | average power supply voltage |
| Vref1, Vref2 | reference voltage |

What is claimed is:

1. A detector circuit (100) for detecting short-lasting voltage pulses (spikes) in a power supply voltage (VDD), the detector circuit comprising
    a) a first memory (MEM1; C1) for storing an energy provided by the power supply voltage;
    b) a second memory (MEM2; C2) for energy, which second memory is connected to the first memory via a switch (S; M1);
    c) a comparator (COMP; M1) which is connected at its input to the power supply voltage and to at least a reference voltage (Vref1, Vref2), and whose output is coupled to the switch in such a way that it closes said switch when the power supply voltage is outside a predetermined voltage interval;
    d) an output circuit (OUT; M2) which is connected at its input to the second memory and is adapted in such a way that it generates an output signal (SPIKE_DET) when the energy in the second memory exceeds a predetermined threshold value.

2. A detector circuit as claimed in claim 1, characterized in that it comprises an integrator (INT) connected to the power supply voltage (VDD), the output of said integrator being connected to the first memory (MEM1).

3. A detector circuit as claimed in claim 1, characterized in that the second memory (MEM2; C2) is self-discharging at a predetermined time constant.

4. A detector circuit as claimed in claim 1, characterized in that a delay circuit (DELAY; R2) for delaying the energy stream is arranged in the connection between the first memory (MEM1; C1) and the second memory (MEM2; C2).

5. A detector circuit as claimed in claim 1, characterized in that the first memory is constituted by a first capacitor (C1) connected between ground and the power voltage (VDD), the connection to the power supply voltage (VDD) being preferably parallel established via a first resistor (R1) and a diode (D1).

6. A detector circuit as claimed in claim 1, characterized in that the comparator is constituted by a first transistor (M1) whose gate is connected to the power supply voltage (VDD), whose source is connected to the first memory (C1) and whose drain is preferably connected to the second memory (C2) via a second resistor (R2).

7. (amended) A detector circuit as claimed in claim 1, characterized in that the second memory is constituted by a second capacitor (C2) whose first terminal is connected to the comparator output and whose second terminal is connected to ground, the first terminal being preferably also connected to ground additionally via a third resistor (R3).

8. A detector circuit as claimed in claim 7, characterized in that the output circuit is constituted by a second transistor (M2), whose gate is connected to the first terminal of the second capacitor (C2) and whose source is connected to ground, and from whose drain the output signal (SPIKE_DET) can be tapped.

9. A data processing unit, particularly in the form of a smart cared, characterized in that it comprises a detector circuit (100) as claimed in claim 1, whose input circuit (OUT; M2) is coupled to an error treatment circuit of the data processing unit.

10. A method of detecting voltage spikes in a power supply voltage (VDD), the method comprising the steps of
    a) storing energy provided by the power supply voltage in a first memory (MEM1; C1);
    b) passing on said energy to a second memory (MEM2; C2) when the power supply voltage is outside a predetermined interval;
    c) generating an output signal (SPIKE_DET) by means of the energy in the second memory, when the energy in the second memory exceeds a predetermined threshold value.

* * * * *